(12) United States Patent
Giridharan (10) Patent No.: US 9,564,863 B1
(45) Date of Patent: Feb. 7, 2017

(54) CIRCUITS AND METHODS FOR VARIABLE GAIN AMPLIFIERS

(71) Applicant: Altera Corporation, San Jose, CA (US)

(72) Inventor: Vishal Giridharan, San Jose, CA (US)

(73) Assignee: Altera Corporation, San Jose, CA (US)

( * ) Notice: Subject to any disclaimer, the term of this patent is extended or adjusted under 35 U.S.C. 154(b) by 60 days.

(21) Appl. No.: 14/536,443

(22) Filed: Nov. 7, 2014

(51) Int. Cl.
*H03F 3/45* (2006.01)
*H03G 3/00* (2006.01)

(52) U.S. Cl.
CPC .......... *H03F 3/45636* (2013.01); *H03G 3/007* (2013.01); *H03F 2203/45074* (2013.01); *H03F 2203/45154* (2013.01)

(58) Field of Classification Search
CPC ....................................................... H03F 3/45
USPC ................................................. 330/254, 258
See application file for complete search history.

(56) References Cited

U.S. PATENT DOCUMENTS

| | | | |
|---|---|---|---|
| 6,429,700 B1 * | 8/2002 | Yang .................... | H03F 3/45511 327/108 |
| 6,509,796 B2 | 1/2003 | Nguyen et al. | |
| 6,747,514 B1 * | 6/2004 | Aude .................. | H03F 3/45188 330/253 |
| 6,891,405 B2 | 5/2005 | Fujimura et al. | |
| 7,154,331 B2 | 12/2006 | Zaguri | |
| 7,378,908 B2 | 5/2008 | Suh et al. | |
| 7,956,687 B2 | 6/2011 | Vakilian | |
| 8,391,350 B2 | 3/2013 | Chan et al. | |
| 8,416,845 B1 | 4/2013 | Wong et al. | |
| 8,582,701 B1 | 11/2013 | McAdam et al. | |
| 9,337,789 B2 * | 5/2016 | Zhang ................. | H03F 3/45219 |
| 2003/0218502 A1 * | 11/2003 | MacTaggart ......... | H03G 1/0023 330/254 |
| 2006/0061415 A1 * | 3/2006 | Bhattacharjee ........... | H03F 1/42 327/563 |
| 2010/0093291 A1 | 4/2010 | Embabi et al. | |
| 2012/0229214 A1 * | 9/2012 | Kasanyal ............ | H03F 3/45192 330/253 |
| 2013/0294546 A1 * | 11/2013 | Emami-Neyestanak . | H03F 1/08 375/319 |

OTHER PUBLICATIONS

Altera Corporation, "Decision Feedback Equalization in Stratix IV Devices," Application Note AN-612-1.1, Jan. 2011, pp. 1-10.
Quoc-Hoang Duong, et al., "A 95-dB Linear Low-Power Variable Gain Amplifier," IEEE Transactions on Circuits and Systems—I: Regular Papers, vol. 53, No. 8, Aug. 2006, pp. 1648-1657.

* cited by examiner

*Primary Examiner* — Patricia T Nguyen
(74) *Attorney, Agent, or Firm* — Steven J. Cahill (57) ABSTRACT

A variable gain amplifier circuit includes a differential pair of transistors and a variable current source circuit. The differential pair of transistors generates an output signal based on an input signal. The variable current source circuit is coupled to the differential pair of transistors. A gain of the output signal relative to the input signal varies in response to variations in a bias current through the variable current source circuit. The variable gain amplifier circuit maintains a common mode voltage of the output signal substantially constant in response to the variations in the bias current through the variable current source circuit.

20 Claims, 6 Drawing Sheets

CIRCUITS AND METHODS FOR VARIABLE GAIN AMPLIFIERS

FIELD OF THE DISCLOSURE

The present disclosure relates to electronic circuits, and more particularly, to circuits and methods for variable gain amplifiers.

BACKGROUND

In many applications, amplifiers are used to amplify an electrical signal. Some amplifiers are designed to have a variable gain. A variable gain amplifier may be implemented using resistive degeneration. A variable gain amplifier with resistive degeneration typically has two transistors and a degeneration resistance. The degeneration resistance is coupled to the transistors. The gain of a variable gain amplifier with resistive degeneration is adjusted by varying the total degeneration resistance that is coupled between the transistors.

BRIEF SUMMARY

According to some embodiments, a variable gain amplifier circuit includes a differential pair of transistors and a variable current source circuit. The differential pair of transistors generates an output signal based on an input signal. The variable current source circuit is coupled to the differential pair of transistors. A gain of the output signal relative to the input signal varies in response to variations in a bias current through the variable current source circuit. The variable gain amplifier circuit maintains a common mode voltage of the output signal substantially constant in response to the variations in the bias current through the variable current source circuit.

Various objects, features, and advantages of the present invention will become apparent upon consideration of the following detailed description and the accompanying drawings.

DETAILED DESCRIPTION

A decision feedback equalizer (DFE) circuit is used in a receiver circuit to reduce or eliminate distortion in an input signal received from an external source. A DFE circuit uses feedback of one or more symbols that were previously detected in an input signal to reduce or eliminate inter-symbol interference (ISI) in a symbol currently being demodulated in the input signal. A DFE circuit subtracts the distortion in a current symbol in the input signal that was caused by one or more symbols previously detected in the input signal.

A decision feedback equalizer (DFE) circuit may be designed to reduce or remove post-cursor ISI caused by bits previously detected in an input data signal. Post-cursor ISI refers to possible erroneous artifacts of the signal information from one unit interval (UI) of a data signal that degrade the data signal during one or more subsequent unit intervals of the data signal. A UI is the time duration of a bit in a data signal.

The amplitude of the input signal to a decision feedback equalizer (DFE) circuit may vary due to changes in the transmitter driver amplitude, the transmission protocol, the transmission distance, the transmission links, the receiver circuitry, as well as other factors. Variations in the amplitude of the input signal may affect the characteristics of the equalization provided by a DFE circuit, and may reduce the quality of the equalization provided by a DFE circuit. A variable gain amplifier may be used in a DFE circuit to provide uniform equalization despite variations in the amplitude of the input signal.

A variable gain amplifier with resistive degeneration typically has large current sources that cause parasitic capacitances at the sources of the transistors. The parasitic capacitances may short out the degeneration resistance at high input signal frequencies. Shorting out the degeneration resistance would cause the frequency response of the variable gain amplifier to peak at high input signal frequencies, which is undesirable.

The bias current of a variable gain amplifier with resistive degeneration remains the same for both high gain and low gain settings. As a result, a variable gain amplifier with resistive degeneration consumes the same amount of power at low gain settings that the variable gain amplifier consumes at high gain settings. A variable gain amplifier with resistive degeneration lacks a power saving mechanism at low gain settings.

According to some embodiments disclosed herein, a variable gain amplifier includes a differential pair of transistors, a variable current source circuit, and a feedback amplifier circuit. The variable current source circuit provides a bias current to the differential pair of transistors. The bias current provided by the variable current source circuit is adjusted to vary the gain of the variable gain amplifier. The bias current provided by the variable current source circuit is reduced to decrease the gain of the variable gain amplifier. Because the bias current is reduced to decrease the gain, the variable gain amplifier consumes less power at lower gain settings. The feedback amplifier maintains the common mode voltage of the output signal of the variable gain amplifier constant. In some embodiments, a variable gain amplifier with a variable bias current does not require an adjustable degeneration resistance, and therefore, does not generate a frequency response that peaks at high input signal frequencies.

Figure 1:
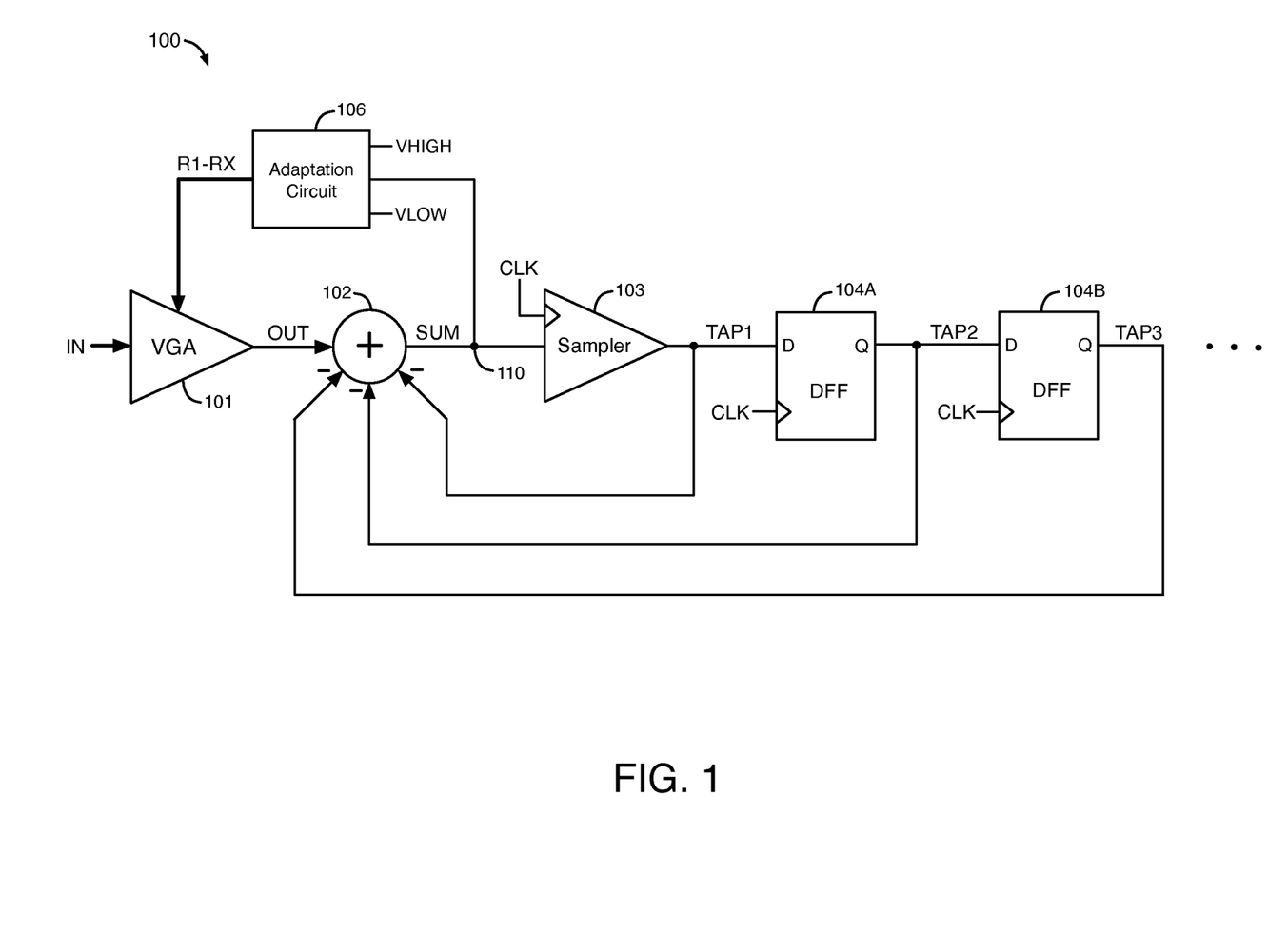
FIG. 1 illustrates an example of a decision feedback equalizer circuit that includes a variable gain amplifier circuit, according to an embodiment of the present invention.

FIG. 1 illustrates an example of a decision feedback equalizer circuit 100 that includes a variable gain amplifier circuit, according to an embodiment of the present invention. Decision feedback equalizer (DFE) 100 may have any number of taps. As an example, DFE 100 may be a 3-tap full-rate decision feedback equalizer as shown in FIG. 1. DFE 100 includes a variable gain amplifier (VGA) circuit 101, a combiner circuit 102, a sampler circuit 103, D flip-flop (DFF) circuits 104A-104B, and an adaptation circuit 106. DFE 100 may be in an integrated circuit.

An input signal IN is provided to an input of variable gain amplifier circuit 101. The input signal IN may, for example, be transmitted from a device external to the integrated circuit that includes DFE 100 to variable gain amplifier circuit 101 through a transmission link. Input signal IN is a differential signal. Input signal IN may, for example, be a data signal.

Variable gain amplifier circuit 101 amplifies input signal IN to generate an output signal OUT at its output. The output signal OUT is provided to a first input of combiner circuit 102. Combiner circuit 102 includes four or more inputs in the embodiment of FIG. 1. Tap signals TAP1, TAP2, and TAP3 are provided to three additional inputs of combiner circuit 102.

In the embodiment shown in FIG. 1, combiner circuit 102 subtracts the voltage of each of the tap signals TAP1, TAP2, and TAP3 from the voltage of the output signal OUT to generate a signal SUM at a summation node 110. Combiner circuit 102 reduces or removes ISI in the current symbol or bit indicated by signal OUT that is caused by previous symbols or bits as indicated by tap signals TAP1-TAP3 to generate signal SUM. In other embodiments, combiner circuit 102 may perform any desired addition or subtraction of its input signals, or any desired combination of addition and subtraction of its input signals to generate signal SUM.

Signal SUM is provided to a first input of sampler circuit 103. A periodic clock signal CLK is provided to a second input of sampler circuit 103. Clock signal CLK may, for example, be generated by a clock data recovery circuit. Sampler circuit 103 samples signal SUM periodically (i.e., at regularly spaced time intervals) in response to clock signal CLK to generate a sampled signal TAP1 at its output. As an example, sampler circuit 103 may sample signal SUM once in each unit interval (UI) of bits in signal SUM at or near the center of each UI. In this example, the period of clock signal CLK may be equal to or twice the UI of bits in signal SUM. Sampler circuit 103 may, for example, output a value in signal TAP1 that is either binary 1 or binary 0, depending on the voltage of signal SUM relative to a reference voltage.

Signal TAP1 is provided to the D input of flip-flop circuit 104A. Clock signal CLK is provided to the clock input of flip-flop circuit 104A. Flip-flop circuit 104A stores the value of signal TAP1 at its Q output in signal TAP2 in response to clock signal CLK. Signal TAP2 is provided to the D input of flip-flop circuit 104B. Clock signal CLK is provided to the clock input of flip-flop circuit 104B. Flip-flop circuit 104B stores the value of signal TAP2 at its Q output in signal TAP3 in response to clock signal CLK. Signals TAP1, TAP2, and TAP3 are provided to inputs of combiner circuit 102, as mentioned above.

In some embodiments, flip-flop circuit 104A stores a new value of signal TAP1 at its Q output in signal TAP2 in each UI of the bits in signal SUM, and flip-flop circuit 104B stores a new value of signal TAP2 at its Q output in signal TAP3 in each UI. In these embodiments, each of the flip-flop circuits 104A-104B delays the signal applied to its D input by an amount of time equal to the time between successive samples taken by sampler circuit 103 in signal TAP1. In these embodiments, the TAP2 signal indicates the bit immediately preceding the bit indicated by signal TAP1, and signal TAP3 indicates the bit immediately preceding the bit indicated by signal TAP2.

Flip-flop circuit 104A may, for example, store a new value of signal TAP1 at its Q output in signal TAP2 at each rising edge of clock signal CLK, at each falling edge of clock signal CLK, or at each rising and falling edge of clock signal CLK. Flip-flop circuit 104B may, for example, store a new value of signal TAP2 at its Q output in signal TAP3 at each rising edge of clock signal CLK, at each falling edge of clock signal CLK, or at each rising and falling edge of clock signal CLK.

According to further embodiments, DFE 100 includes three or more D flip-flop circuits. The additional D flip-flop circuits are coupled in series to delay the TAP3 signal in response to clock signal CLK. Each of the additional D flip-flop circuits generates an additional tap output signal based on a tap input signal that is derived from signal TAP3. Each of the additional D flip-flop circuits delays the bits in signal TAP3 by an additional UI. The tap output signal generated by each D flip-flop circuit is provided to an additional input of combiner circuit 102. In these embodiments, combiner circuit 102 subtracts the voltage of each of the tap signals TAP1, TAP2, TAP3, etc. from the voltage of the output signal OUT to generate the signal SUM at summation node 110.

According to additional embodiments, DFE 100 may include scaler circuits. Each of the scaler circuits is coupled to the Q output of a different one of the flip-flop circuits 104A, 104B, etc. One of the scaler circuits may be coupled to the output of sampler circuit 103. Each of the scaler circuits multiplies the tap signal applied to it from the respective sampler circuit 103 or flip-flop circuit 104A, 104B, etc. by a tap coefficient to generate a scaled signal. Each of the tap coefficients can be varied independently of the other tap coefficients. The tap coefficients may be selected to increase, to decrease, or maintain the voltage of the scaled signals relative to the voltages of the respective tap signals. The scaled signals are applied to the inputs of the combiner circuit 102 in these embodiments instead of the tap output signals of the sampler circuit 103 and the flip-flop circuits 104A, 104B, etc. The combiner circuit 102 subtracts the voltage of each of the scaled signals from the voltage of the output signal OUT to generate signal SUM at summation node 110.

The SUM signal is also provided to an input of adaptation circuit 106. Two reference voltages VHIGH and VLOW are provided to additional inputs of adaptation circuit 106. Adaptation circuit 106 generates two or more digital output signals R1-RX. Signals R1-RX are provided to control inputs of variable gain amplifier circuit 101. Signals R1-RX determine the gain of variable gain amplifier circuit 101, as disclosed in further detail below with respect to FIGS. 2-3.

Adaptation circuit 106 compares the voltage of signal SUM at summation node 110 to the reference voltages VHIGH and VLOW. If the voltage of signal SUM increases above reference voltage VHIGH, then adaptation circuit 106 adjusts signals R1-RX to values that indicate to decrease the gain of variable gain amplifier circuit 101. Decreasing the gain of variable gain amplifier circuit 101 decreases the voltage of signal OUT relative to the voltage of signal IN. Combiner circuit 102 decreases the voltage of signal SUM in response to a decrease in the voltage of signal OUT. If the voltage of signal SUM decreases below reference voltage VLOW, then adaptation circuit 106 adjusts signals R1-RX to values that indicate to increase the gain of variable gain amplifier circuit 101. Increasing the gain of variable gain amplifier circuit 101 increases the voltage of signal OUT relative to the voltage of signal IN. Combiner circuit 102 increases the voltage of signal SUM in response to an increase in the voltage of signal OUT. As a result, adaptation circuit 106 causes the voltage of signal SUM to remain within a range defined by reference voltages VHIGH and VLOW. Adaptation circuit 106 may be implemented using, for example, one or more comparator circuits.

Figure 2:
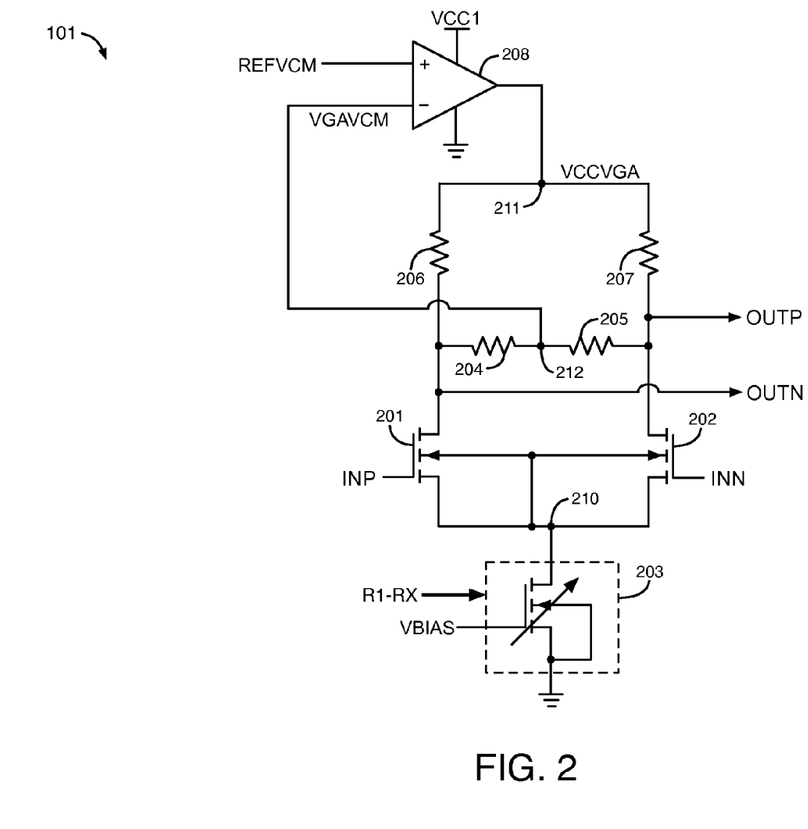
FIG. 2 illustrates an example of the variable gain amplifier circuit shown in FIG. 1, according to an embodiment of the present invention.

FIG. 2 illustrates an example of variable gain amplifier circuit 101, according to an embodiment of the present invention. In the embodiment of FIG. 2, variable gain amplifier circuit 101 includes n-channel field-effect transistors (FETs) 201 and 202, variable current source circuit 203, resistors 204-207, and operational amplifier (Op Amp) circuit 208. Transistors 201-202 are enhancement mode FETs. Resistors 204-207 may be passive resistors, transistors coupled to function as resistors, or any combination of these circuits.

The gain of variable gain amplifier circuit 101 varies in response to changes in the current through variable current source circuit 203. The current through variable current source circuit 203 changes in response to changes in the values of signals R1-RX. The operation of variable gain amplifier circuit 101 is now described in further detail.

Two input signals INP and INN are shown in FIG. 2. The difference between signal INP and signal INN equals the differential input signal IN shown in FIG. 1 (i.e., IN=INP−INN). Input signal INP is provided to the gate of transistor 201, and input signal INN is provided to the gate of transistor 202. Variable gain amplifier circuit 101 generates output signal OUTP at the drain of transistor 202 and output signal OUTN at the drain of transistor 201 in response to input signals INP and INN. The difference between signals OUTP and OUTN equals the differential output signal OUT shown in FIG. 1 (i.e., OUT=OUTP−OUTN).

The sources of transistors 201 and 202 are coupled together at source node 210. The substrate terminals of transistors 201 and 202 are also coupled to source node 210. Variable current source circuit 203 is coupled between source node 210 and a node at a ground voltage. The drain of transistor 201 is coupled to resistors 204 and 206. The drain of transistor 202 is coupled to resistors 205 and 207. Resistors 206 and 207 are coupled together at node 211. The resistance of resistor 206 equals the resistance of resistor 207. Resistors 206-207 are load circuits.

Resistors 204 and 205 are coupled together at node 212. Resistors 204 and 205 are coupled in series between the output at output signal OUTP and the output at output signal OUTN. The resistance of resistor 204 equals the resistance of resistor 205. Therefore, the voltage VGAVCM at node 212 between resistors 204 and 205 equals the common mode voltage of the output signal OUT.

The inverting input of operational amplifier circuit 208 is coupled to node 212. The non-inverting input of operational amplifier circuit 208 is coupled to receive a reference voltage REFVCM. The output of operational amplifier circuit 208 is coupled to node 211. Operational amplifier circuit 208 receives a supply voltage VCC1 and is coupled to a node at the ground voltage. Operational amplifier circuit 208 generates a supply voltage VCCVGA at node 211 based on the difference between reference voltage REFVCM and the common mode voltage VGAVCM of the output signal OUT at node 212.

Transistors 201-202 are coupled to form a differential pair of transistors. In variable gain amplifier circuit 101, current flows from supply voltage VCCVGA through one or both of load resistors 206-207, through one or both of transistors 201 and 202, and through variable current source circuit 203 to ground. The current through transistor 201 plus the current through transistor 202 equals the bias current through variable current source circuit 203.

When the voltage of input signal INP equals the voltage of input signal INN, the current through transistor 201 equals the current through transistor 202, and the voltage of output signal OUTP equals the voltage of output signal OUTN, if transistors 201-202 are matched. When the voltage of input signal INP is greater than the voltage of input signal INN, the current through transistor 201 is greater than the current through transistor 202, and the voltage of output signal OUTP is greater than the voltage of output signal OUTN. When the voltage of input signal INN is greater than the voltage of input signal INP, the current through transistor 202 is greater than the current through transistor 201, and the voltage of output signal OUTN is greater than the voltage of output signal OUTP.

In response to the voltage of input signal IN (i.e., INP−INN) increasing, the current through transistor 201 increases, the current through transistor 202 decreases, the voltage of output signal OUTP increases, and the voltage of output signal OUTN decreases. Thus, variable gain amplifier circuit 101 increases the voltage of output signal OUT (i.e., OUTP−OUTN) in response to an increase in the voltage of input signal IN.

In response to the voltage of input signal IN decreasing, the current through transistor 201 decreases, the current through transistor 202 increases, the voltage of output signal OUTP decreases, and the voltage of output signal OUTN increases. Thus, variable gain amplifier circuit 101 decreases the voltage of output signal OUT in response to a decrease in the voltage of input signal IN.

The bias current through variable current source circuit 203 is controlled by a bias voltage VBIAS and by the output signals R1-RX of adaptation circuit 106. The bias current through variable current source circuit 203 changes in response to changes in the values of signals R1-RX. The bias current through variable current source circuit 203 increases in response to changes in the values of signals R1-RX that indicate to increase the gain of variable gain amplifier circuit 101. The bias current through variable current source circuit 203 decreases in response to changes in the values of signals R1-RX that indicate to decrease the gain of variable gain amplifier circuit 101.

The gain G of variable gain amplifier circuit 101 equals the voltage VOUT of output signal OUT divided by the voltage VIN of input signal IN (i.e., G=VOUT/VIN). According to the classical square law theory for field-effect transistors, the gain of a field-effect transistor is directly proportional to the square root of the current through the field-effect transistor.

Variable gain amplifier circuit 101 varies its gain G based on changes in the bias current through variable current source circuit 203. Variable gain amplifier circuit 101 increases its gain G in response to an increase in the bias current through variable current source circuit 203. Variable gain amplifier circuit 101 decreases its gain G in response to a decrease in the bias current through variable current source circuit 203. Because the bias current is reduced to decrease the gain of variable gain amplifier circuit 101, variable gain amplifier circuit 101 consumes less power at a lower gain compared to the power that variable gain amplifier circuit 101 consumes at a higher gain.

Figure 3:
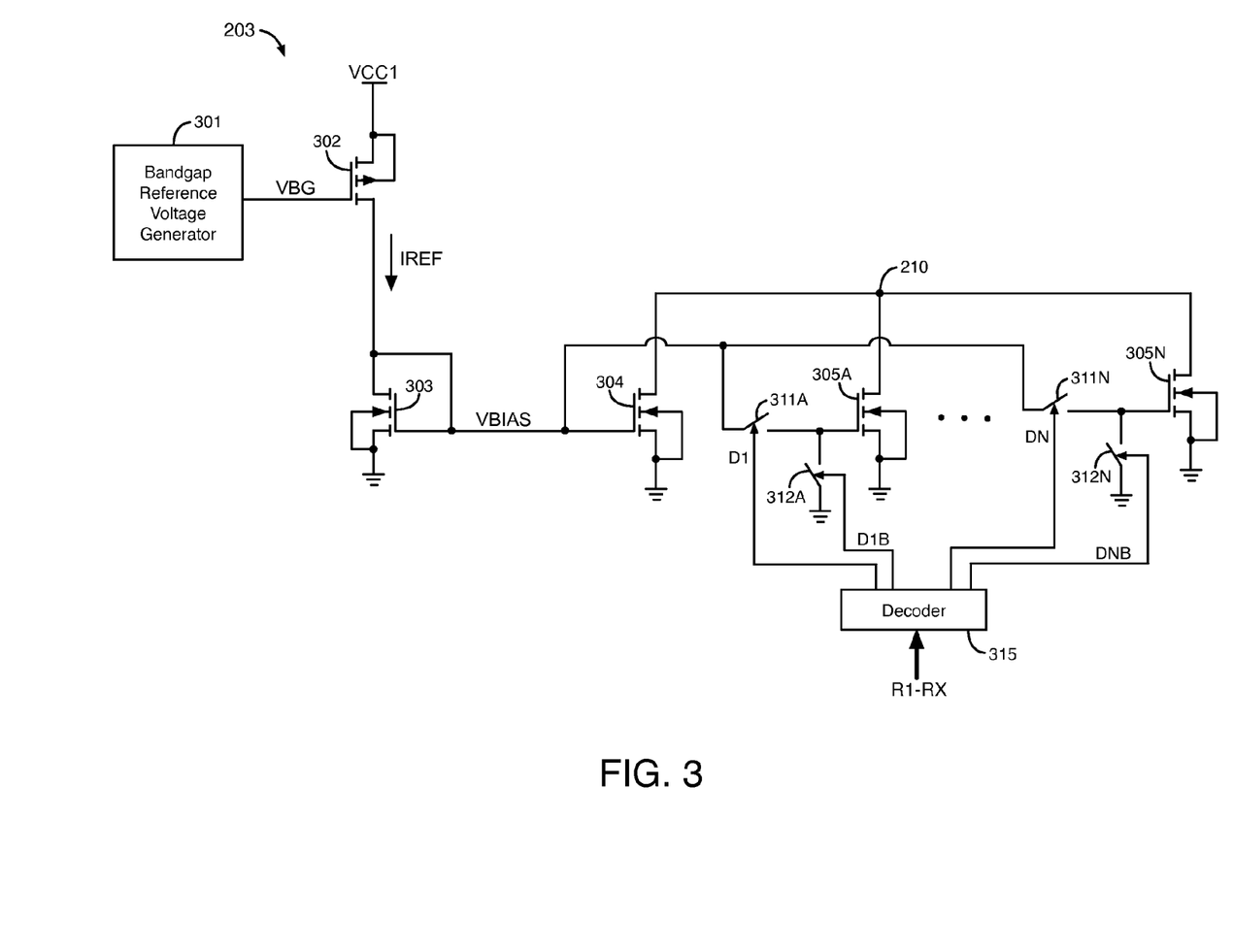
FIG. 3 illustrates an example of the variable current source circuit shown in FIG. 2, according to an embodiment of the present invention.

FIG. 3 illustrates an example of variable current source circuit 203, according to an embodiment of the present invention. In the embodiment of FIG. 3, variable current source circuit 203 includes p-channel field-effect transistor (FET) 302, n-channel field-effect transistors (FETs) 303, 304 and 305A-305N, switch circuits 311A-311N and 312A-312N, and decoder circuit 315. Transistors 302, 303, 304, and 305A-305N are enhancement mode FETs. The substrate of each of the transistors 302, 303, 304, and 305A-305N is coupled to its respective source.

Variable current source circuit 203 includes an N number of two or more transistors 305A-305N, including transistors 305A and 305N. N is any integer that is greater than 1. Each of the transistors 305A-305N is coupled between source node 210 and a node at the ground voltage. Variable current source circuit 203 also includes an N number of switch circuits 311A-311N and an N number of switch circuits 312A-312N. The gate of each of the transistors 305A-305N is coupled to a respective one of switch circuits 311A-311N and to a respective one of switch circuits 312A-312N. For example, the gate of transistor 305A is coupled to switch circuits 311A and 312A, and the gate of transistor 305N is coupled to switch circuits 311N and 312N.

The source of p-channel transistor 302 is coupled to a node at supply voltage VCC1. The drain of transistor 302 is coupled to the drain and the gate of n-channel transistor 303. The source of transistor 303 is coupled to a node at the ground voltage. The gate of transistor 303 is coupled to the gate of n-channel transistor 304. The drains of n-channel transistors 304 and 305A-305N are coupled to the sources of transistors 201-202 at source node 210. The sources of transistors 304 and 305A-305N are coupled to a node at the ground voltage. Switch circuit 311A is coupled between the gates of transistors 303-304 and the gate of transistor 305A. Switch circuit 311N is coupled between the gates of transistors 303-304 and the gate of transistor 305N. Switch circuit 312A is coupled between the gate of transistor 305A and a node at the ground voltage. Switch circuit 312N is coupled between the gate of transistor 305N and a node at the ground voltage.

FIG. 3 also illustrates a bandgap reference voltage generator circuit 301 that generates a bandgap voltage VBG. The bandgap voltage VBG is constant over changes in the temperature and the process of DFE circuit 100. The bandgap voltage VBG is provided to the gate of p-channel transistor 302. Transistor 302 generates a constant reference current IREF based on the constant bandgap voltage VBG. The reference current IREF is provided through n-channel transistor 303 to the node at the ground voltage. The reference current IREF generates a constant bias voltage VBIAS at the gates of transistors 303 and 304 and at a first terminal of each of switch circuits 311A-311N.

In variable current source circuit 203, the reference current IREF charges up the gate voltage VBIAS of transistors 303 and 304 until VBIAS is greater than the threshold voltages of transistors 303 and 304. Bandgap reference voltage generator circuit 301 and transistor 302 cause transistors 303 and 304 to remain on during the operation of variable gain amplifier circuit 101. Transistors 303 and 304 are coupled as a current mirror circuit. The reference current IREF is mirrored in transistor 304 according to the relative width-to-length (W/L) channel ratios of transistors 303 and 304. For example, if the W/L channel ratio of transistor 304 is twice the W/L channel ratio of transistor 303, then the current through transistor 304 equals 2×IREF. If the W/L channel ratio of transistor 304 divided by the W/L channel ratio of transistor 303 equals a number Q, then the minimum bias current provided by variable current source circuit 203 equals Q×IREF.

Signals R1-RX are provided to inputs of decoder circuit 315. Signals R1-RX may be, for example, binary encoded or thermometer encoded. Decoder circuit 315 controls the conductive states of switch circuits 311A-311N and 312A-312N based on signals R1-RX. Decoder circuit 315 decodes signals R1-RX to generate decoded signals D1-DN and D1B-DNB. Decoder circuit 315 generates an N number of signals D1-DN and an N number of signals D1B-DNB. Signals D1B-DNB have the opposite logic states of signals D1-DN, respectively. For example, signals D1 and D1B have opposite logic states, and signals DN and DNB have opposite logic states.

Signals D1-DN are provided to control inputs of switch circuits 311A-311N, respectively. Decoder circuit 315 uses signals D1-DN to control whether switch circuits 311A-311N, respectively, are opened or closed. Signals D1B-DNB are provided to control inputs of switch circuits 312A-312N, respectively. Decoder circuit 315 uses signals D1B-DNB to control whether switch circuits 312A-312N, respectively, are opened or closed.

Decoder circuit 315 causes any one of transistors 305A-305N to turn off by opening the respective one of switch circuits 311A-311N and closing the respective one of switch circuits 312A-312N. When one of switch circuits 312A-312N is closed, the gate of the respective transistor 305A-305N is coupled to a node at the ground voltage, which causes the respective transistor 305A-305N to be off.

Decoder circuit 315 causes any one of transistors 305A-305N to turn on by closing the respective one of switch circuits 311A-311N and opening the respective one of switch circuits 312A-312N. When one of switch circuits 311A-311N is closed, the gate of the respective transistor 305A-305N is coupled to the gates of transistors 303-304 at voltage VBIAS, which causes the respective transistor 305A-305N to be on. Decoder circuit 315 determines how many of transistors 305A-305N to turn on and how many of transistors 305A-305N to turn off based on the values of signals R1-RX.

The transistors 305A-305N that are on are coupled to transistors 303 and 304 as a current mirror circuit. The reference current IREF is mirrored in the transistors 305A-305N that are on according to the relative width-to-length (W/L) channel ratios of transistor 303 and transistors 305A-305N, respectively. If the W/L channel ratio of any one of transistors 305A-305N divided by the W/L channel ratio of transistor 303 equals a number K, then the current through the respective transistor 305A-305N equals K×IREF when the respective transistor 305A-305N is on.

In response to each change in signals R1-RX that indicates to increase the gain of variable gain amplifier circuit 101, decoder circuit 315 adjusts signals D1-DN and D1B-DNB to increase the bias current through variable current source circuit 203. In response to each change in signals R1-RX that indicates to decrease the gain of variable gain amplifier circuit 101, decoder circuit 315 adjusts signals D1-DN and D1B-DNB to decrease the bias current through variable current source circuit 203.

In an embodiment, each of transistors 305A-305N has the same W/L channel ratio. In this embodiment, decoder circuit 315 increases the bias current through variable current source circuit 203 by increasing the number of transistors 305A-305N that are on. In this embodiment, decoder circuit 315 decreases the bias current through variable current source circuit 203 by decreasing the number of transistors 305A-305N that are on.

In another embodiment, transistors 304 and 305A-305N have binary weighted W/L channel ratios. For example, transistors 304 and 305A-305N may have relative W/L channel ratios of 1×, 2×, 4×, 8×, 16×, etc., respectively. In this embodiment, the bias current through variable current source circuit 203 is based on the combined W/L channel ratio of the transistors 305A-305N that are on. Decoder circuit 315 increases the bias current through variable current source circuit 203 by increasing the combined W/L channel ratio of the transistors 305A-305N that are on. Decoder circuit 315 decreases the bias current through variable current source circuit 203 by decreasing the combined W/L channel ratio of the transistors 305A-305N that are on.

Referring again to FIG. 2, the common mode voltage of output signal OUTP–OUTN would vary in response to changes in the bias current through variable current source circuit 203, if variable gain amplifier circuit 101 did not include operational amplifier circuit 208. Operational amplifier circuit 208 maintains the common mode voltage of output signal OUTP–OUTN constant over variations in the bias current through variable current source circuit 203.

Operational amplifier circuit 208 is coupled in a closed loop negative feedback configuration, because the output of operational amplifier circuit 208 is coupled to the inverting input of operational amplifier circuit 208 through resistors 206 and 204. Operational amplifier circuit 208 drives its output voltage VCCVGA to a voltage that causes the common mode voltage VGAVCM of output signal OUTP–OUTN at node 212 to be nearly equal to the reference voltage REFVCM. Operational amplifier circuit 208 has a high gain that drives the voltage difference between REFVCM and VGAVCM to a very low voltage near zero. Operational amplifier circuit 208 is a feedback amplifier circuit in variable gain amplifier circuit 101.

The reference voltage REFVCM is selected to equal an ideal common mode voltage for the output signal OUTP–OUTN of variable gain amplifier circuit 101. The reference voltage REFVCM is maintained at a constant voltage during the operation of variable gain amplifier circuit 101. Operational amplifier circuit 208 maintains the common mode voltage VGAVCM of output signal OUTP–OUTN at node 212 at a constant voltage that is nearly equal to voltage REFVCM in response to variations in the bias current through variable current source circuit 203. As a result, the common mode voltage VGAVCM of output signal OUTP–OUTN remains constant during the operation of variable gain amplifier circuit 101.

Figure 4:
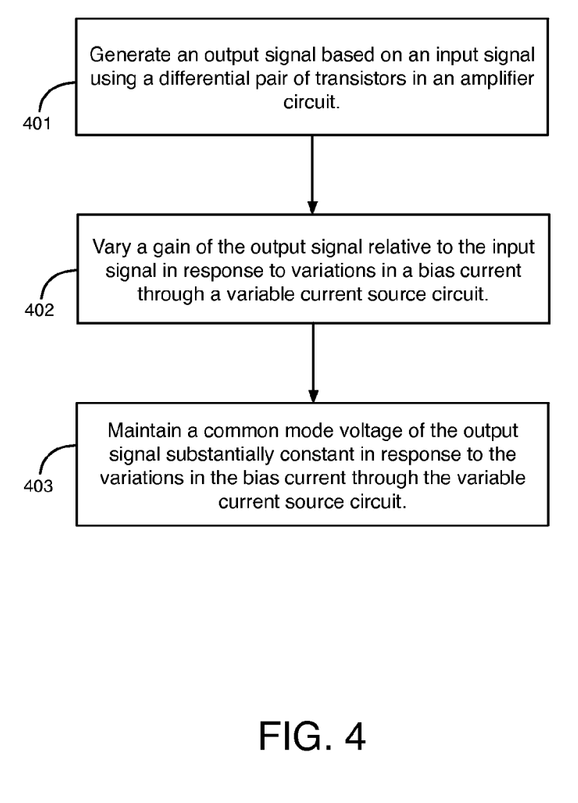
FIG. 4 illustrates examples of operations for the variable gain amplifier circuit shown in FIG. 2, according to an embodiment of the present invention.

FIG. 4 illustrates examples of operations for variable gain amplifier circuit 101, according to an embodiment of the present invention. In operation 401, amplifier circuit 101 generates an output signal OUT based on an input signal IN using the differential pair of transistors 201-202. In operation 402, a gain of the output signal OUT relative to the input signal IN varies in response to variations in a bias current through variable current source circuit 203. In operation 403, a common mode voltage of the output signal OUT is maintained substantially constant in response to the variations in the bias current through variable current source circuit 203.

Figure 5:
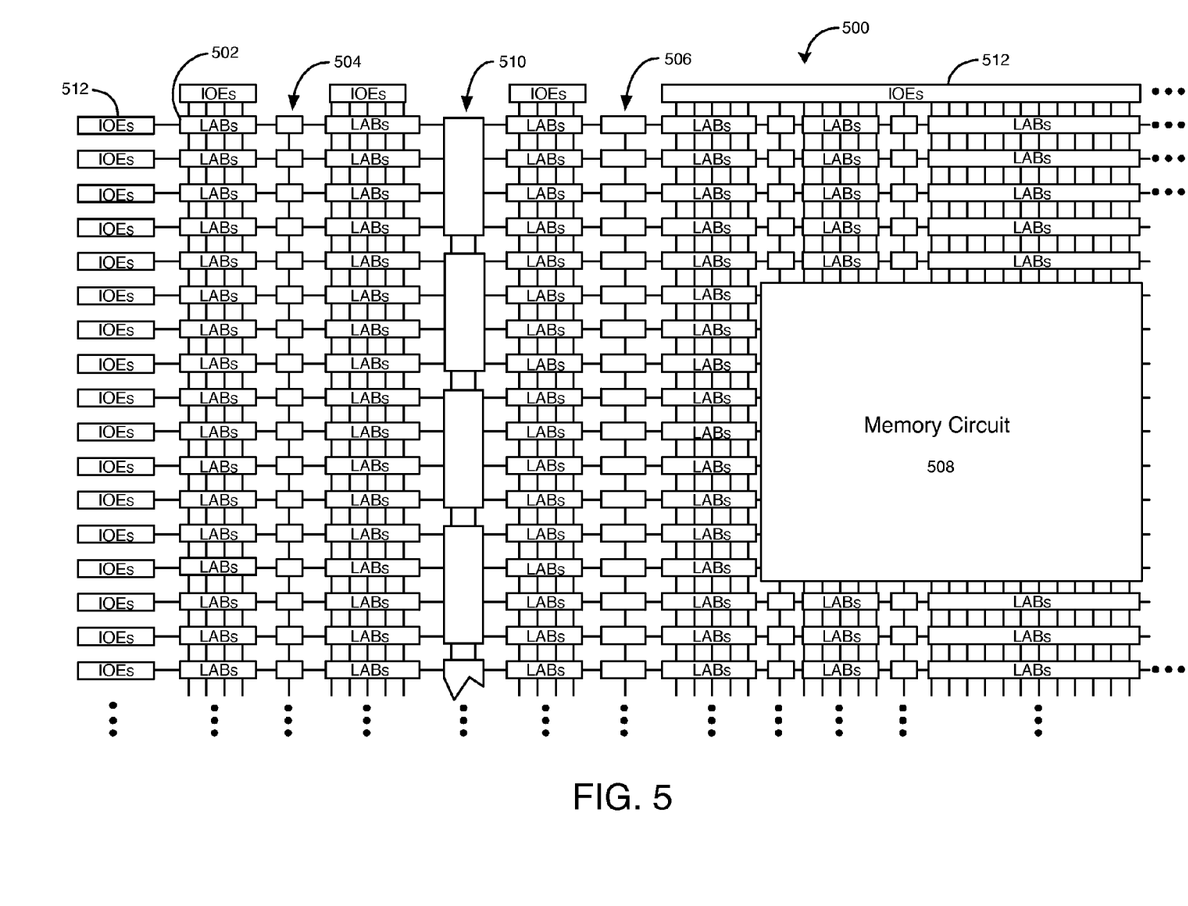
FIG. 5 is a partial block diagram of a field programmable gate array (FPGA) that can include aspects of the present invention.

FIG. 5 is a partial block diagram of a field programmable gate array (FPGA) 500 that can include aspects of the present invention. FPGA 500 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 500 includes a two-dimensional array of programmable logic array blocks (or LABs) 502 that are interconnected by a network of column and row interconnect conductors of varying length and speed. LABs 502 include several logic elements (or LEs).

A logic element (LE) is a programmable logic circuit block that provides for efficient implementation of user defined logic functions. An FPGA has numerous logic elements that can be configured to implement various combinatorial and sequential functions. The logic elements have access to a programmable interconnect structure of interconnect conductors. The programmable interconnect structure can be programmed to interconnect the logic elements in almost any desired configuration.

FPGA 500 may also include a distributed memory structure including random access memory (RAM) circuits of varying sizes provided throughout the array. The RAM circuits include, for example, circuits 504, circuits 506, and circuit 508. These memory circuits can also include shift registers and first-in first-out (FIFO) circuits.

FPGA 500 may further include digital signal processing (DSP) circuits 510 that can implement, for example, multipliers with add or subtract features. Input/output elements (IOEs) 512 support numerous single-ended and differential input/output standards. IOEs 512 may include input and output buffers that are coupled to pins of the integrated circuit. The pins are external terminals of the FPGA die that can be used to route, for example, input signals, output signals, and supply voltages between the FPGA and one or more external devices. FPGA 500 may also include one or more DFE circuits 100. FPGA 500 is described herein for illustrative purposes. Embodiments of the present invention can be implemented in many different types of integrated circuits.

Figure 6:
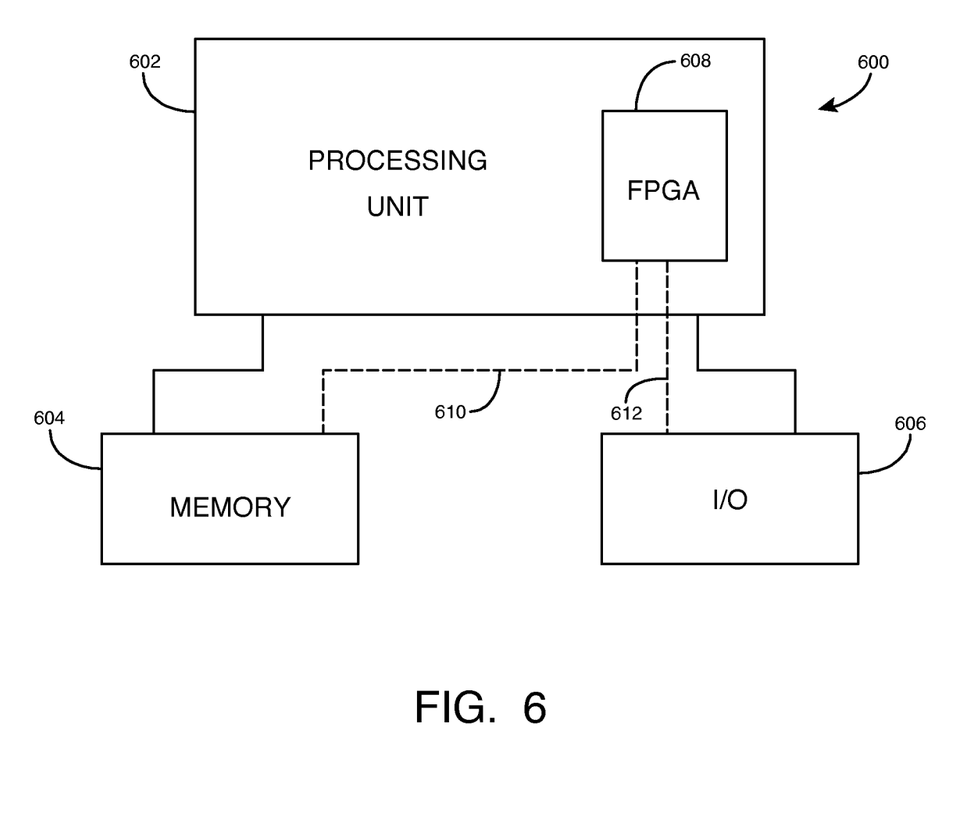
FIG. 6 shows a block diagram of an exemplary digital system that can embody techniques of the present invention.

The present invention can also be implemented in a system that has an FPGA as one of several components. FIG. 6 shows a block diagram of an exemplary digital system 600 that can embody techniques of the present invention. System 600 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 600 can be provided on a single board, on multiple boards, or within multiple enclosures.

System 600 includes a processing unit 602, a memory unit 604, and an input/output (I/O) unit 606 interconnected together by one or more buses. According to this exemplary embodiment, an FPGA 608 is embedded in processing unit 602. FPGA 608 can serve many different purposes within the system of FIG. 6. FPGA 608 can, for example, be a logical building block of processing unit 602, supporting its internal and external operations. FPGA 608 is programmed to implement the logical functions necessary to carry on its particular role in system operation. FPGA 608 can be specially coupled to memory 604 through connection 610 and to I/O unit 606 through connection 612.

Processing unit 602 can direct data to an appropriate system component for processing or storage, execute a program stored in memory 604, receive and transmit data via I/O unit 606, or other similar functions. Processing unit 602 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 608 can control the logical operations of the system. As another example, FPGA 608 acts as a reconfigurable processor that can be reprogrammed as needed to handle a particular computing task. Alternatively, FPGA 608 can itself include an embedded microprocessor. Memory unit 604 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A variable gain amplifier circuit comprising:
   a differential pair of transistors to generate an output signal based on an input signal;
   a variable current source circuit coupled to the differential pair of transistors, wherein a gain of the output signal relative to the input signal varies in response to variations in a bias current through the variable current source circuit, and
   wherein the variable gain amplifier circuit maintains a common mode voltage of the output signal substantially constant in response to the variations in the bias current through the variable current source circuit; and
   an operational amplifier circuit to generate a supply voltage for the variable gain amplifier circuit based on a reference voltage and the common mode voltage of the output signal.

2. The variable gain amplifier circuit of claim 1,
   wherein the operational amplifier circuit is a feedback amplifier circuit that maintains the common mode voltage of the output signal substantially constant in response to the variations in the bias current through the variable current source circuit.

3. The variable gain amplifier circuit of claim 1 further comprising:
   a first resistor coupled to a first transistor in the differential pair of transistors; and
   a second resistor coupled between the first resistor and a second transistor in the differential pair of transistors, wherein a first input of the operational amplifier circuit is coupled between the first and the second resistors, and wherein a second input of the operational amplifier circuit receives the reference voltage.

4. The variable gain amplifier circuit of claim 1 further comprising:
   a first resistor coupled between an output of the operational amplifier circuit and a first transistor in the differential pair of transistors; and
   a second resistor coupled between the output of the operational amplifier circuit and a second transistor in the differential pair of transistors.

5. The variable gain amplifier circuit of claim 4 further comprising:
   a third resistor coupled to the first transistor; and
   a fourth resistor coupled between the third resistor and the second transistor, wherein an input of the operational amplifier circuit is coupled between the third and the fourth resistors.

6. The variable gain amplifier circuit of claim 1, wherein the variable current source circuit comprises a current source transistor and first and second switch circuits coupled to a control input of the current source transistor, wherein adjusting a conductive state of the current source transistor varies the bias current through the variable current source circuit, wherein the current source transistor is turned on by closing the first switch circuit, and wherein the current source transistor is turned off by closing the second switch circuit.

7. A variable gain amplifier circuit comprising:
   a differential pair of transistors to generate an output signal based on an input signal;
   a variable current source circuit coupled to the differential pair of transistors, wherein a gain of the output signal relative to the input signal varies in response to variations in a bias current through the variable current source circuit; and
   a feedback amplifier circuit to maintain a common mode voltage of the output signal substantially constant in response to the variations in the bias current through the variable current source circuit.

8. The variable gain amplifier circuit of claim 1, wherein an adaptation circuit in a decision feedback equalizer circuit generates control signals for controlling the bias current through the variable current source circuit.

9. The variable gain amplifier circuit of claim 8, wherein the decision feedback equalizer circuit further comprises a combiner circuit to generate a combined signal based at least in part on the output signal of the variable gain amplifier circuit, and wherein the adaptation circuit generates the control signals based on the combined signal.

10. A decision feedback equalizer circuit comprising:
    a variable gain amplifier circuit comprising a differential pair of transistors to generate an output signal based on an input signal, wherein the variable gain amplifier circuit further comprises a variable current source circuit coupled to the differential pair of transistors, wherein a gain of the output signal relative to the input signal varies in response to variations in a bias current through the variable current source circuit, and wherein the variable gain amplifier circuit maintains a common mode voltage of the output signal substantially constant over the variations in the bias current;
    a combiner circuit to generate a combined signal based at least in part on the output signal of the variable gain amplifier circuit; and
    an adaptation circuit to generate control signals for varying the bias current through the variable current source circuit based on the combined signal.

11. The decision feedback equalizer circuit of claim 10, wherein the variable gain amplifier circuit further comprises:
    an operational amplifier circuit to generate a supply voltage for the variable gain amplifier circuit based on a difference between a reference voltage and the common mode voltage of the output signal.

12. The decision feedback equalizer circuit of claim 10, wherein the variable gain amplifier circuit further comprises:
    a feedback amplifier circuit to maintain the common mode voltage of the output signal substantially constant over the variations in the bias current, wherein the feedback amplifier circuit provides a supply voltage to load circuits in the variable gain amplifier circuit based on the common mode voltage of the output signal.

13. The decision feedback equalizer circuit of claim 12, wherein the variable gain amplifier circuit further comprises:
- a first resistor coupled to a first transistor in the differential pair of transistors; and
- a second resistor coupled between the first resistor and a second transistor in the differential pair of transistors, wherein a first input of the feedback amplifier circuit is coupled between the first and the second resistors, and wherein a second input of the feedback amplifier circuit receives a reference voltage.

14. The decision feedback equalizer circuit of claim 12, wherein the differential pair of transistors comprises first and second transistors, and wherein the variable gain amplifier circuit further comprises:
- a first resistor coupled between an output of the feedback amplifier circuit and the first transistor; and
- a second resistor coupled between the output of the feedback amplifier circuit and the second transistor, wherein the first and the second resistors are the load circuits.

15. The decision feedback equalizer circuit of claim 14, wherein the variable gain amplifier circuit further comprises:
- a third resistor coupled to the first transistor; and
- a fourth resistor coupled between the third resistor and the second transistor, wherein an input of the feedback amplifier circuit is coupled between the third and the fourth resistors.

16. A method comprising:
- generating an output signal based on an input signal using a differential pair of transistors in an amplifier circuit;
- varying a gain of the output signal relative to the input signal in response to variations in a bias current through a variable current source circuit in the amplifier circuit; and
- generating a supply voltage for the amplifier circuit using an operational amplifier circuit to maintain a common mode voltage of the output signal substantially constant in response to the variations in the bias current through the variable current source circuit.

17. The method of claim 16, wherein the operational amplifier circuit generates the supply voltage for the amplifier circuit based on a reference voltage and the common mode voltage of the output signal.

18. The method of claim 17, wherein generating a supply voltage for the amplifier circuit using an operational amplifier circuit to maintain a common mode voltage of the output signal substantially constant in response to the variations in the bias current through the variable current source circuit further comprises generating the common mode voltage of the output signal using resistors coupled between first and second outputs of the amplifier circuit, wherein the supply voltage for the amplifier circuit is generated at load circuits that are coupled to the differential pair of transistors.

19. A method comprising:
- generating an output signal based on an input signal using a differential pair of transistors in an amplifier circuit;
- varying a gain of the output signal relative to the input signal in response to variations in a bias current through a variable current source circuit in the amplifier circuit; and
- maintaining a common mode voltage of the output signal substantially constant in response to the variations in the bias current through the variable current source circuit by maintaining the common mode voltage of the output signal near a reference voltage using a feedback amplifier circuit.

20. The method of claim 16 further comprising:
- generating a combined signal based at least in part on the output signal of the amplifier circuit using a combiner circuit; and
- generating control signals for controlling the bias current through the variable current source circuit based on the combined signal using an adaptation circuit.

* * * * *